US010644541B2

(12) United States Patent
Zhao et al.

(10) Patent No.: US 10,644,541 B2
(45) Date of Patent: May 5, 2020

(54) TRANSFORMER AND POWER SUPPLY BOARD

(71) Applicant: BOE Technology Group Co., Ltd., Beijing (CN)

(72) Inventors: Tianyue Zhao, Beijing (CN); Masakazu Okamura, Beijing (CN); Weiqing Guo, Beijing (CN)

(73) Assignee: BOE Technology Group Co., Ltd., Beijing (CN)

( * ) Notice: Subject to any disclaimer, the term of this patent is extended or adjusted under 35 U.S.C. 154(b) by 191 days.

(21) Appl. No.: 15/535,927

(22) PCT Filed: Jan. 3, 2017

(86) PCT No.: PCT/CN2017/000011
§ 371 (c)(1),
(2) Date: Jun. 14, 2017

(87) PCT Pub. No.: WO2017/193604
PCT Pub. Date: Nov. 16, 2017

(65) Prior Publication Data
US 2018/0204673 A1 Jul. 19, 2018

(30) Foreign Application Priority Data
May 10, 2016 (CN) .......................... 2016 1 0305994

(51) Int. Cl.
H01F 27/42 (2006.01)
H01F 37/00 (2006.01)
(Continued)

(52) U.S. Cl.
CPC .............. H02J 50/12 (2016.02); H01F 38/14 (2013.01); H01Q 7/08 (2013.01); H02J 5/005 (2013.01);
(Continued)

(58) Field of Classification Search
CPC .. H01F 38/14; H01F 2027/2819; H02J 50/12; H02J 5/005; H02J 7/025; H02J 50/10; H04B 5/0093
See application file for complete search history.

(56) References Cited

U.S. PATENT DOCUMENTS

2002/0110013 A1* 8/2002 Park ..................... H01F 27/2804
363/153
2006/0164811 A1* 7/2006 Maxwell .............. H05K 1/0203
361/709
(Continued)

FOREIGN PATENT DOCUMENTS

CN 1237081 A 12/1999
CN 1363940 A 8/2002
(Continued)

OTHER PUBLICATIONS

Oct. 26, 2018—(CN) Second Office Action Appn 201610305994.7 with English Translation.
(Continued)

Primary Examiner — Hal Kaplan
Assistant Examiner — Rasem Mourad
(74) Attorney, Agent, or Firm — Banner & Witcoff, Ltd.

(57) ABSTRACT

Provided are a transformer and a power supply board including the transformer, the transformer includes: a power supply circuit, wherein the power supply circuit includes a power supply antenna and the power supply circuit is configured to transmit electric power through the power supply antenna; and a power receiving circuit, wherein the power receiving circuit includes a power receiving antenna and the power receiving circuit is configured to receive the electric power transmitted by the power supply antenna through the power receiving antenna. The transformer uses the principle of resonance wireless charging so as to improve the working frequency of the transformer, decrease the
(Continued)

volume and weight of the transformer, save a magnetic core, and decrease or eliminate the magnetic core loss.

12 Claims, 4 Drawing Sheets

(51) Int. Cl.
*H01F 38/00* (2006.01)
*H02J 50/12* (2016.01)
*H02J 7/00* (2006.01)
*H02J 50/10* (2016.01)
*H01F 38/14* (2006.01)
*H01Q 7/08* (2006.01)
*H02J 5/00* (2016.01)
*H04B 5/00* (2006.01)
*H01F 27/28* (2006.01)
*H02J 7/02* (2016.01)
*H05K 1/14* (2006.01)

(52) U.S. Cl.
CPC ............ *H02J 7/0042* (2013.01); *H02J 50/10* (2016.02); *H04B 5/0093* (2013.01); *H01F 2027/2819* (2013.01); *H01F 2038/143* (2013.01); *H02J 7/025* (2013.01); *H05K 1/14* (2013.01)

(56) References Cited

U.S. PATENT DOCUMENTS

| | | | | |
|---|---|---|---|---|
| 2008/0197802 | A1* | 8/2008 | Onishi | H02J 5/005 320/106 |
| 2010/0045590 | A1* | 2/2010 | Kumamoto | G02F 1/13452 345/102 |
| 2012/0019075 | A1* | 1/2012 | Cho | H01F 38/14 307/104 |
| 2015/0280452 | A1* | 10/2015 | Nalbant | H04B 5/0037 307/104 |
| 2016/0056639 | A1* | 2/2016 | Mao | H02J 50/80 307/104 |
| 2016/0094074 | A1* | 3/2016 | Alves | H02J 7/025 320/108 |
| 2016/0276944 | A1* | 9/2016 | Guepratte | H05K 1/0233 |

FOREIGN PATENT DOCUMENTS

| | | | |
|---|---|---|---|
| CN | 101178968 | A * | 5/2008 |
| CN | 101178968 | A | 5/2008 |
| CN | 104393690 | A | 3/2015 |
| CN | 105262242 | A | 1/2016 |
| CN | 105513774 | A | 4/2016 |
| CN | 105529835 | A | 4/2016 |
| CN | 105932789 | A | 9/2016 |
| CN | 205595907 | U | 9/2016 |
| EP | 0935263 | A2 | 8/1999 |
| EP | 1221753 | A2 | 7/2002 |

OTHER PUBLICATIONS

Jan. 2, 2018—(CN) First Office Action Appn 201610305994.7 with English Tran.
Apr. 11, 2017—(CN) International Search Report and Written Opinion Appn PCT/CN2017/000011 with English Tran.

* cited by examiner

TRANSFORMER AND POWER SUPPLY BOARD

The application is a U.S. National Phase Entry of International Application No. PCT/CN2017/000011 filed on Jan. 3, 2017, designating the United States of America and claiming priority to Chinese Patent Application No. 201610305994.7, filed on May 10, 2016. The present application claims priority to and the benefit of the above-identified applications and the above-identified applications are incorporated by reference herein in their entirety.

TECHNICAL FIELD

Embodiments of the present disclosure relates to a transformer and a power supply board.

BACKGROUND

A transformer is a device which uses the principle of the electromagnetic induction to change an alternating voltage. For instance, an existing transformer mainly comprises a primary coil, a secondary coil, and a magnetic core. In the case that an alternating current (AC) appears in the primary coil, an AC flux is generated in the magnetic core so as to induce a voltage (or a current) in the secondary coil.

The main functions of the transformer comprise voltage conversion, current conversion, impedance conversion, isolation, voltage stabilization, etc.

SUMMARY

An embodiment of the present disclosure provide a transformer, comprising: a power supply circuit, wherein the power supply circuit comprises a power supply antenna and the power supply circuit is configured to transmit electric power through the power supply antenna; and a power receiving circuit, wherein the power receiving circuit comprises a power receiving antenna and the power receiving circuit is configured to receive the electric power transmitted by the power supply antenna through the power receiving antenna.

For instance, in the transformer provided by an embodiment of the present disclosure, the power supply antenna is separated from the power receiving antenna.

For instance, in the transformer provided by an embodiment of the present disclosure, the power supply circuit comprises a power supply ground terminal, the power receiving circuit comprises a power receiving ground terminal, and the power supply ground terminal is electrically connected with the power receiving ground terminal.

For instance, in the transformer provided by an embodiment of the present disclosure, the power supply circuit further comprises a power supply loop, the power receiving circuit further comprises a power receiving loop, the power supply loop, the power supply antenna, the power receiving antenna and the power receiving loop are disposed on a same printed circuit board.

For instance, in the transformer provided by an embodiment of the present disclosure, the printed circuit board comprises a first side and a second side which are disposed opposite to each other, the power supply antenna is disposed on the first side of the printed circuit board, and the power receiving antenna is disposed on the second side of the printed circuit board.

For instance, in the transformer provided by an embodiment of the present disclosure, the power supply antenna is disposed on a surface of the first side, and the power receiving antenna is disposed on a surface of the second side.

For instance, in the transformer provided by an embodiment of the present disclosure, the power supply antenna and the power receiving antenna both are helical antennas.

For instance, in the transformer provided by an embodiment of the present disclosure, the power supply antenna and the power receiving antenna both are cylindrical helical antennas.

For instance, in the transformer provided by an embodiment of the present disclosure, the cylindrical helical power supply antenna and the cylindrical helical power receiving antenna are coaxially disposed.

For instance, in the transformer provided by an embodiment of the present disclosure, an axis of the cylindrical helical power supply antenna and an axis of the cylindrical helical power receiving antenna both are perpendicular to the surface of the first side or the surface of the second side.

For instance, in the transformer provided by an embodiment of the present disclosure, the transformer is a resonance wireless power supply transformer.

For instance, in the transformer provided by an embodiment of the present disclosure, a working frequency of the transformer is 10 kHz to 30 MHz.

For instance, in the transformer provided by an embodiment of the present disclosure, the power supply loop comprises a power supply resonance circuit and a high frequency resonance modulation circuit, and the power receiving loop comprises a power receiving resonance circuit and an AC-DC converter.

For instance, in the transformer provided by an embodiment of the present disclosure, the power supply loop further comprises a power supply source, a gate driver, a control circuit, a crystal oscillator, and a power supply communication circuit; and the power receiving loop further comprises a DC transformer, a battery, a battery monitoring circuit, a manostat, and a power receiving communication circuit which communicates with the power supply communication circuit.

For instance, in the transformer provided by an embodiment of the present disclosure, the power supply communication circuit and the power receiving communication circuit both are wireless communication circuits.

Embodiments of the present disclosure further provide a power supply board, comprising the transformer according to any one of the embodiments of the present disclosure.

BRIEF DESCRIPTION OF THE DRAWINGS

In order to clearly illustrate the technical solution of the embodiments of the disclosure, the drawings of the embodiments will be briefly described in the following; it is obvious that the described drawings are only related to some embodiments of the disclosure and thus are not limitative of the disclosure.

DETAILED DESCRIPTION

Figure 1:
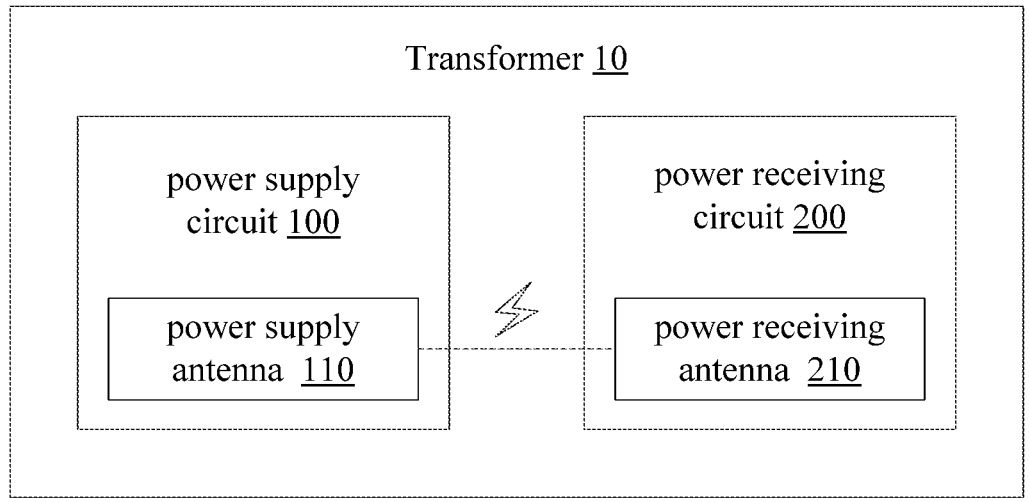
FIG. 1 is a first structural block diagram of a transformer provided by an embodiment of the present disclosure.

The technical solutions of the embodiments will be described in a clearly and fully understandable way in connection with the drawings related to the embodiments of the disclosure. With reference to non-limitative embodiments shown in the drawings and described in detail below, the embodiments of the present disclosure and their various features and advantageous details will be described more fully. It should be noted that the features shown in the drawings are not drawn in a real scale. The present disclosure omits the description of the known materials, components, and process techniques, so as not to blur the embodiments of the present disclosure. The provided examples are only intended to understand the implementation of the embodiments of the present disclosure, and so that the skilled in the field can implement the embodiments. Thus, these embodiments should not be interpreted as limitations of the scope of the embodiments of the present disclosure.

Unless otherwise defined, all the technical and scientific terms used herein have the same meanings as commonly understood by one of ordinary skill in the art to which the present disclosure belongs. The terms "first," "second," etc., which are used in the description and the claims of the present application for disclosure, are not intended to indicate any sequence, amount or importance, but distinguish various components. In addition, in the embodiments of the present disclosure, the same or the similar reference labels represent the same or the similar components.

Magnetic core loss, volume and weight of a transformer are related to the working frequency of the transformer; if increasing the working frequency of the transformer, the volume and the weight of the transformer are decreased, but the magnetic core loss of the transformer is increased; if decreasing the working frequency of the transformer, the magnetic core loss is decreased, but the volume and the weight of the transformer are increased.

The working frequency of the transformer is usually under 100 kHz, and the volume and the weight of the transformer are large. If the working frequency of the transformer is increased (for instance, the working frequency is increased to 6.78 MHz, 13.56 MHz or 27.12 MHz), the volume and the weight of the transformer is decreased, but the magnetic core loss is increased.

An embodiment of the present disclosure provides a transformer, which uses the principle of resonance wireless charging, so as to improve the working frequency of the transformer, decrease the volume and weight of the transformer, save a magnetic core, and decrease or eliminate the magnetic core loss.

For instance, FIG. 1 is a first structural block diagram of a transformer provided by an embodiment of the present disclosure. As illustrated in FIG. 1, an embodiment of the present disclosure provides a transformer 10, comprising: a power supply circuit 100, wherein the power supply circuit 100 comprises a power supply antenna 110 and the power supply circuit 100 is configured to transmit electric power through the power supply antenna 110; and a power receiving circuit 200, wherein the power receiving circuit 200 comprises a power receiving antenna 210 and the power receiving circuit 200 is configured to receive the electric power transmitted by the power supply antenna 110 through the power receiving antenna 210.

For instance, the transformer 10 provided by the embodiment of the present disclosure transmits the electric power through the power supply antenna 110 and the power receiving antenna 210 and does not need a magnetic core, so that the volume and the weight of the transformer and the magnetic core loss can be decreased at the same time.

Figure 2:
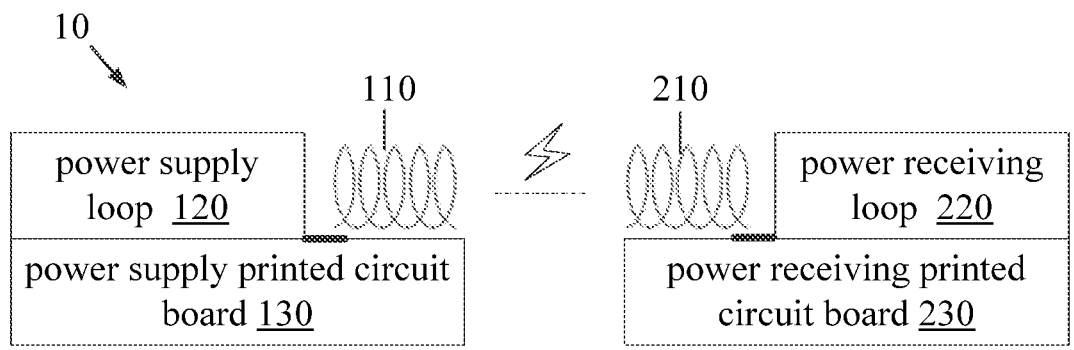
FIG. 2 is a first schematic diagram of a transformer provided by an embodiment of the present disclosure.

For instance, FIG. 2 is a first schematic diagram of the transformer provided by an embodiment of the present disclosure. As illustrated in FIG. 2, in the transformer 10 provided by the embodiment of the present disclosure, the power supply antenna 110 is separated from the power receiving antenna 210. For instance, the power supply antenna 110 and the power receiving antenna 210 are disposed on different printed circuit boards respectively.

For instance, the power supply circuit 100 further comprises a power supply loop 120 and a power supply printed circuit board 130, and the power supply loop 120 is disposed on the power supply printed circuit board 130; the power receiving circuit 200 further comprises a power receiving loop 220 and a power receiving printed circuit board 230, and the power receiving loop 220 is disposed on the power receiving printed circuit board 230.

For instance, the power supply antenna 110 is electrically connected with the power supply loop 120, and converts an energy signal (such as, high frequency oscillation current, guided wave, or other forms of energy carriers) provided by the power supply loop 120 into electromagnetic wave to transmit. The power receiving antenna 210 is electrically connected with the power receiving loop 220, and the power receiving antenna 210 converts the received electromagnetic wave into a corresponding energy signal (such as, high frequency oscillation current, guided wave, or other forms of energy carriers), and transmits the energy signal to the power receiving loop 220. The power supply loop 120 can convert the energy signal into electrical energy to store or use. Therefore, the electric power transmission between the power supply terminal and the power receiving terminal can be realized through the power supply antenna 110, the power supply loop 120, the power receiving loop 220 and the power receiving antenna 210.

For instance, in the transformer 10 provided by the embodiment of the present disclosure, the power supply antenna 110 and the power receiving antenna 210 both are helical antennas. For instance, the power supply antenna 110 and the power receiving antenna 210 both are cylindrical helical antennas. For instance, the cylindrical helical power supply antenna 110 and the cylindrical helical power receiving antenna 210 are coaxially disposed. For instance, the cylindrical helical power supply antenna 110 and the cylindrical helical power receiving antenna 210 are coaxially disposed, which can improve the efficiency of transmitting the electric power between the cylindrical helical power supply antenna 110 and the cylindrical helical power receiving antenna 210. It should be noted that the power supply antenna 110 and the power receiving antenna 210 provided by the embodiment of the present disclosure comprise, but limited to, the helical antennas or the cylindrical helical antennas, and the shapes of the power supply antenna 110 and the power receiving antenna 210 may be selected according to actual requirements.

For instance, the current flowing through the power supply antenna 110 is I, the coil number of the power supply antenna 110 is n, and the coil radius of the power supply antenna 110 is r, so the magnetic field strength at a position where a transmission distance is X (for instance, a position where the axial distance from the power supply antenna 100 is X) is H, which satisfies the following formula:

$$H = \frac{nIr^2}{2a^3}$$

wherein $a = \sqrt{r^2 + x^2}$

For instance, the power receiving antenna 210 may be located at the position where the transmission distance is X. For instance, the coil number and the coil radius of the power supply antenna 110, the coil number and the coil radius of the power receiving antenna 210, and the distance between the power supply antenna 110 and the power receiving antenna 210 may be selected according to actual requirements of the electric power transmission.

For instance, in the transformer 10 provided by the embodiment of the present disclosure, the power supply circuit 100 comprises a power supply ground terminal, the power receiving circuit 200 comprises a power receiving ground terminal, and the power supply ground terminal is electrically connected with the power receiving ground terminal. For instance, the power supply loop 120 comprises the power supply ground terminal, the power receiving loop 220 comprises the power receiving ground terminal, and the power supply ground terminal is electrically connected with the power receiving ground terminal. The power supply ground terminal being electrically connected with the power receiving ground terminal can improve the stability of the transformer 10.

Figure 3:
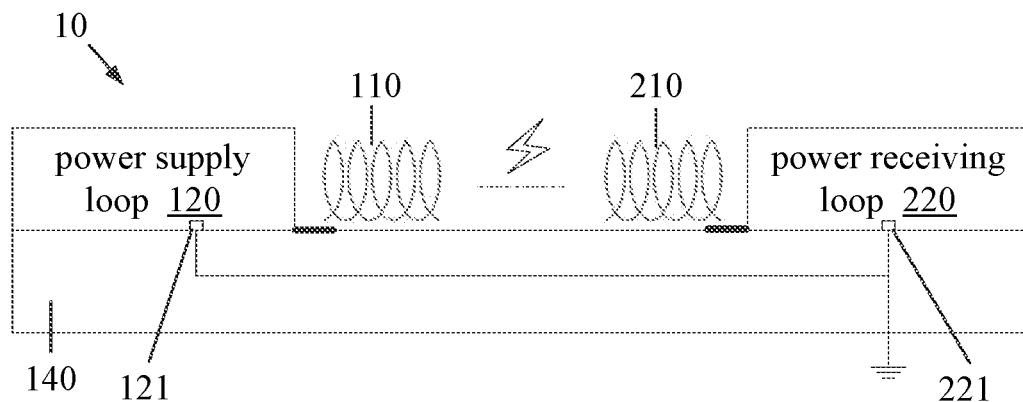
FIG. 3 is a second schematic diagram of a transformer provided by an embodiment of the present disclosure.

For instance, FIG. 3 is a second schematic diagram of a transformer provided by an embodiment of the present disclosure. As illustrated in FIG. 3, in the transformer 10 provided by the embodiment of the present disclosure, the power supply circuit 100 comprises the power supply antenna 110 and the power supply loop 120, and the power receiving circuit 200 comprises the power receiving antenna 210 and the power receiving loop 220. The power supply loop 120, the power supply antenna 110, the power receiving antenna 210 and the power receiving loop 220 are disposed on a same printed circuit board 140.

For instance, the configuration in which the power supply loop 120, the power supply antenna 110, the power receiving antenna 210 and the power receiving loop 220 are disposed on the same printed circuit board 140 can reduce the volume of the transformer 10, save space and improve an efficiency of the transformer 10; also, because it only needs to design one printed circuit board 140, the design of the transformer 10 becomes easier.

For instance, as illustrated in FIG. 3, the power supply loop 120 comprises the power supply ground terminal 121, the power receiving loop 220 comprises the power receiving ground terminal 221, and the power supply ground terminal 121 is electrically connected with the power receiving ground terminal 221. For instance, the power supply ground terminal being electrically connected with the power receiving ground terminal can improve the insulation and the stability of the transformer 10.

Figure 4A:
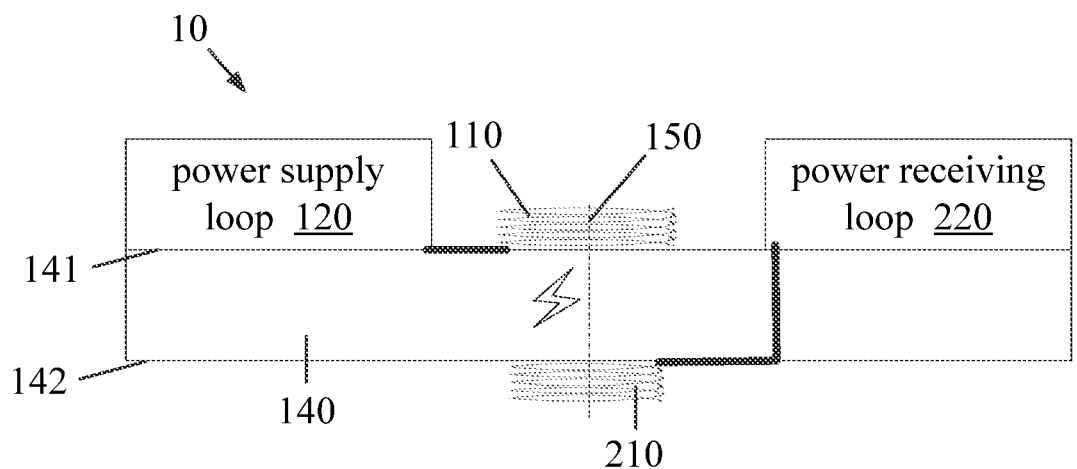
FIG. 4A is a third schematic diagram of a transformer provided by an embodiment of the present disclosure.
Figure 4B:
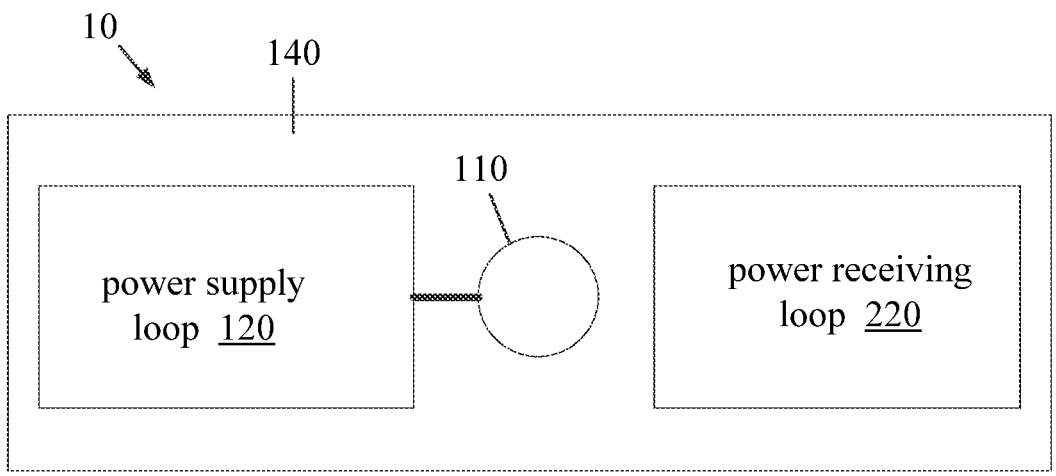
FIG. 4B is a top schematic diagram of the transformer shown in FIG. 4A.
Figure 4C:
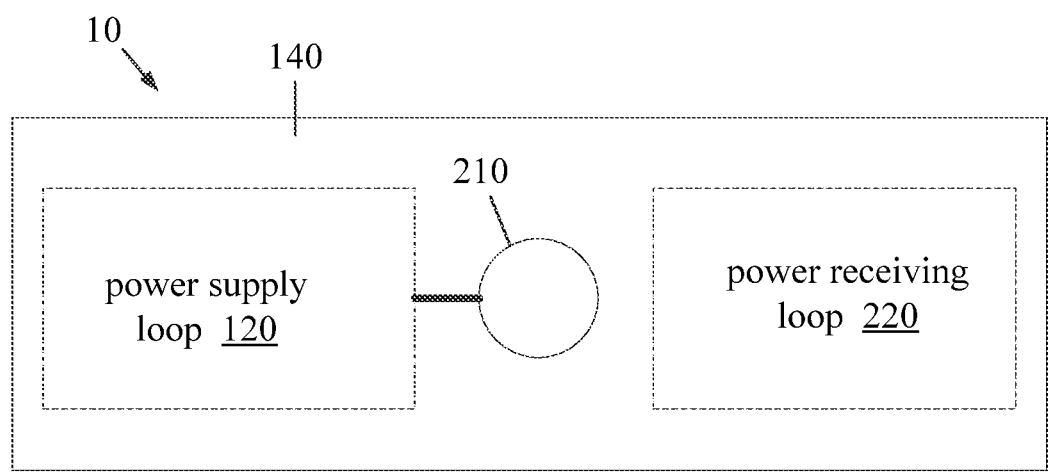
FIG. 4C is a bottom schematic diagram of the transformer shown in FIG. 4A.

For instance, FIG. 4A is a third schematic diagram of a transformer provided by an embodiment of the present disclosure, FIG. 4B is a top schematic diagram of the transformer shown in FIG. 4A, and FIG. 4C is a bottom schematic diagram of the transformer shown in FIG. 4A. As illustrated in FIG. 4A, FIG. 4B and FIG. 4C, in the transformer 10 provided by the embodiment of the present disclosure, the printed circuit board 140 comprises a first side 141 and a second side 142 which are opposite to each other, the power supply antenna 110 is disposed on the first side 141 of the printed circuit board 140, and the power receiving antenna 210 is disposed on the second side 142 of the printed circuit board 140. For instance, the power supply antenna 110 is disposed on the surface of the first side 141, and the power receiving antenna 210 is disposed on the surface of the second side 142.

For instance, the configuration in which the power supply antenna 110 and the power receiving antenna 210 are respectively disposed on the first side 141 and the second side 142 of the printed circuit board can reduce the distance between the power supply antenna 110 and the power receiving antenna 210, save space and furthermore reduce the volume of the transformer, and also the design of the transformer becomes easier and more efficient.

For instance, in the transformer 10 provided by the embodiment of the present disclosure, the power supply antenna 110 and the power receiving antenna 210 both are helical antennas. For instance, the power supply antenna 110 and the power receiving antenna 210 both are cylindrical helical antennas. For instance, in the transformer 10 provided by the embodiment of the present disclosure, the cylindrical helical power supply antenna 110 and the cylindrical helical power receiving antenna 120 are coaxially disposed, as illustrated in FIG. 4A, that is to say, an axis 150 of the cylindrical helical power supply antenna 110 coincides with an axis of the cylindrical helical power receiving antenna 210. For instance, the cylindrical helical power supply antenna 110 and the cylindrical helical power receiving antenna 120 are coaxially disposed, which can improve the efficiency of transmitting the electric power between the cylindrical helical power supply antenna 110 and the cylindrical helical power receiving antenna 120. It should be noted that, the axis 150 is a geometric factor of a cylindrical antenna and is not a component of the cylindrical helical power supply antenna 110 or the cylindrical helical power receiving antenna 210, and the axis 150 is only used for describing the position relationship between the cylindrical helical power supply antenna 110 and the cylindrical helical power receiving antenna 210. In some embodiments, the axis of the cylindrical helical power supply antenna 110 and the axis of the cylindrical helical power receiving antenna 210 may be parallel to each other, and the two axes do not coincide with each other.

For instance, in the transformer 10 provided by an embodiment of the present disclosure, the axis 150 of the cylindrical helical power supply antenna 110 and the axis of the cylindrical helical power receiving antenna 210 are both perpendicular to the surface of the first side 141 or the surface of the second side 142, that is to say, the cylindrical helical power supply antenna 110 and the cylindrical helical power receiving antenna 210 both are perpendicular to the printed circuit board, which can further reduce the volume of the transformer 10.

For instance, modes of wireless power supply are divided into a non-radioactive mode and a radioactive mode, the radioactive wireless power supply comprises electromagnetic induction wireless power supply and resonance wireless power supply, and the non-radioactive wireless power supply comprises radio receiving wireless power supply. The resonance wireless power supply, for instance, may transmit the electric power which is less than 10 kilowatts in 10 meters, has the efficiency of 30% to 60%, and has larger degree of freedom of position. For instance, the transformer 10 provided by an embodiment of the present disclosure is a resonance wireless power supply transformer.

For instance, the working frequency of the transformer 10 provided by an embodiment of the present disclosure is 10 kHz to 30 MHz.

Figure 5:
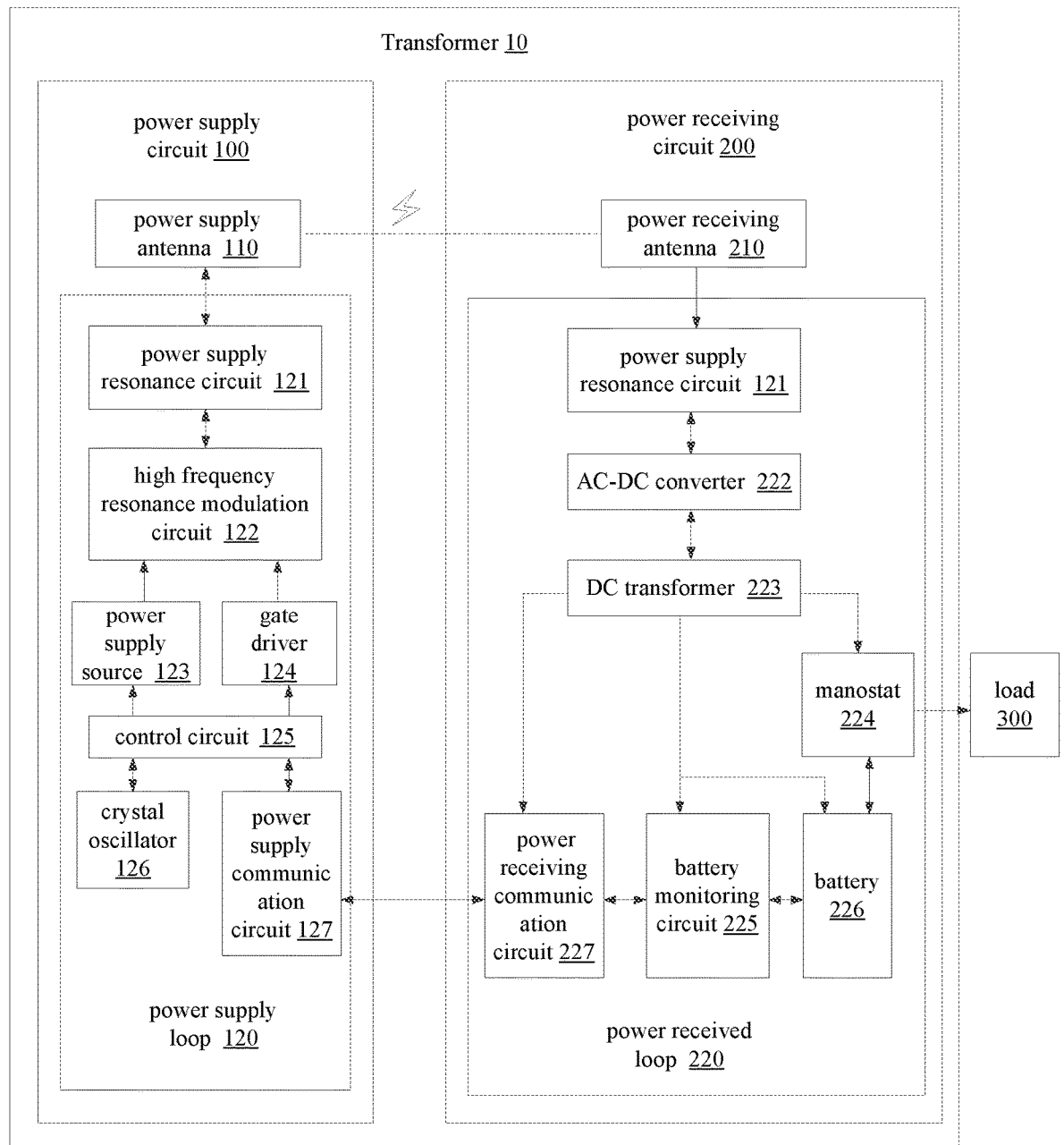
FIG. 5 is a second structural block diagram of a transformer provided by an embodiment of the present disclosure.

For instance, FIG. 5 is a second structural block diagram of a transformer provided by an embodiment of the present disclosure. As illustrated in FIG. 5, in the transformer 10 provided by the embodiment of the present disclosure, the power supply loop 120 comprises a power supply resonance circuit 121 and a high frequency resonance modulation circuit 122; and the power receiving loop 220 comprises a power receiving resonance circuit 221 and an AC-DC converter 222.

For instance, the power supply resonance circuit 121 and the high frequency resonance modulation circuit 122 provide the energy signal for the power supply antenna 110, the power supply antenna 110 converts the energy signal into electromagnetic wave and transmits the electromagnetic wave to the power receiving antenna 210, the power receiving antenna 210 receives the electromagnetic wave and converts the electromagnetic wave into corresponding energy signal. The power receiving resonance circuit 221 converts the received energy signal into an AC signal, and the AC-DC converter 222 converts the AC signal into a DC signal. The DC signal which is processed can be used to supply electricity for a load.

For instance, in the transformer 10 provided by an embodiment of the present disclosure, the power supply loop 120 further comprises a power supply source 123, a gate driver 124, a control circuit 125, a crystal oscillator 126, and a power supply communication circuit 127; and the power receiving supply loop 220 further comprises a DC transformer 223, a manostat 224, a battery monitoring circuit 225, a battery 226, and a power receiving communication circuit 227 which communicates with the power supply communication circuit 127.

For instance, frequency of the crystal oscillator 126 is 27.12 MHz.

For instance, the gate driver 124 comprises a gallium nitride (GaN) gate driver or a metal oxide semiconductor (MOS) gate driver.

For instance, in the transformer 10 provided by an embodiment of the present disclosure, the power supply communication circuit 127 and the power receiving communication circuit 227 both are wireless communication circuits. For instance, the power supply communication circuit 127 and the power receiving communication circuit 227 both are bluetooth communication circuits or Zigbee communication circuits. Certainly, the power supply communication circuit 127 and the power receiving communication circuit 227 may also be wire communication circuits (such as, electrical cable communication circuits or optical cable communication circuits).

For instance, in the power supply circuit 100, through the gate driver 124, the control circuit 125 converts the signal generated by the crystal oscillator 126 into the signal of the frequency which the high frequency resonance modulation circuit 122 requires (namely the frequency which the power supply antenna 110 requires, such as 13.56 MHz).

The power supply communication circuit 127 may receive a control signal transmitted by the power receiving communication circuit 227. The control signal may comprise a power supply start signal, a power supply stop signal or the other control signals. For instance, in the case that the power supply communication circuit 127 receives the power supply stop signal transmitted by the power receiving communication circuit 227, the power supply communication circuit 127 transmits the power supply stop signal to the control circuit 125, so that the control circuit 125 transmits the power supply stop signal to the power supply source 123, and the power supply source 123 (such as a DC source) stops supplying electricity. In the case that the power supply communication circuit 127 receives the power supply start signal transmitted by the power receiving communication circuit 227, the power supply communication circuit 127 transmits the power supply start signal to the control circuit 125, so that the control circuit 125 transmits the power supply start signal to the power supply source 123, and the power supply source 123 supplies electricity. The high frequency resonance modulation circuit 122 converts the electric power provided by the power supply source 123 into an electrical signal which can be transmitted, and the electrical signal is resonated by the power supply resonance circuit 121, and then is transmitted through the power supply circuit 110. Certainly, the power receiving communication circuit 227 also can receive a signal transmitted by the power supply communication circuit 127.

For instance, in the power receiving circuit 200, the power receiving antenna 210 receives the electromagnetic wave transmitted by the power supply antenna 110 and converts the electromagnetic wave into an energy signal (such as a high frequency current signal), the power receiving resonance circuit 221 converts the energy signal into an AC signal, and the AC-DC converter 222 converts the AC signal into a DC signal. The DC transformer 223 can converts the voltage of the DC signal into a suitable working voltage. The DC transformer 223 can transmit the converted DC signal to the manostat 224, after being regulated by the manostat 224, the DC signal can be transmitted to a load 300 of the transformer 10. The DC transformer 223 may also transmit the converted DC signal to the battery 226 so as to charge the battery 226 (for instance, managing the chip by the battery), and provide electricity to the battery monitoring circuit 225 at the same time, and the battery monitoring circuit 225 is configured to monitor the state of the battery 226 (for instance, the state of electricity quantity of the battery 226). The DC transformer 223 also may transmit the converted DC signal to the power receiving communication circuit 227, so as to supply electricity to the power receiving communication circuit 227. The power receiving communication circuit 227 may receive the battery state information transmitted by the battery monitoring circuit 225, and transmits the battery state information to the power supply communication circuit 127.

For instance, the battery 226 may also provide electricity to the load 300 through the output of the manostat 224. For instance, in the case that the electricity quantity of the battery 226 drops below an electricity quantity threshold (such as 30%), the battery monitoring circuit 225 transmits a signal showing that the electricity quantity of the battery 226 is low to the power receiving communication circuit 227, and the power receiving communication circuit 227 transmits the signal to the power supply communication circuit 127 through the wireless communication mode (such as Bluetooth or Zigbee). The power supply communication circuit 127 transmits the received signal to the control circuit 125, so that the control circuit 125 controls the power supply source 123 to provide electricity (namely, the power supply circuit 100 starts to provide electricity to the load 300 and charges the battery 226 at the same time). In the case that the battery 226 completes charging, the power supply circuit 100 stops to provide electricity, and at the same time, the battery 226 provides electricity to the load 300. For instance, the power supply circuit 100 may also continuously provide electricity, and the battery 226 may be only used as backup.

For instance, the control circuit 125 may be realized by programmable circuits such as DSP, FPGA, PLC and the like.

For instance, the battery monitoring circuit 225 may be realized by a microcontroller.

Figure 6:
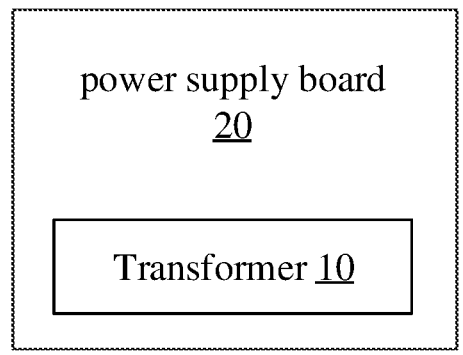
FIG. 6 illustrates a power supply board provided by an embodiment of the present disclosure.

As shown in FIG. 6, an embodiment of the present disclosure further provides a power supply board 20, comprising the transformer 10 provided by any one of the embodiments of the present disclosure. For instance, the power supply board 20 is applied to a liquid crystal television or other electronic device which needs a transformer.

Embodiments of the present disclosure provide a transformer and a power supply board, the transformer uses the principle of resonance wireless charging, so as to improve the working frequency of the transformer, decrease the volume and weight of the transformer, save a magnetic core and decrease or eliminate the magnetic core loss.

Although the present disclosure has be described in detail above through the general description and specific embodiments, but on the basis of the embodiments of the present disclosure, some modifications or improvements can be made, which is obvious to the skilled in the field. Therefore, these modifications or improvements made without departing from the spirit of the present disclosure are within the scope of the present disclosure.

The application claims priority to the Chinese patent application No. 201610305994.7, filed on May 10, 2016, the entire disclosure of which is incorporated herein by reference as part of the present application.

What is claimed is:

1. A transformer, comprising:
   a power supply circuit, wherein the power supply circuit comprises a power supply antenna and the power supply circuit is configured to transmit electric power through the power supply antenna; and
   a power receiving circuit, wherein the power receiving circuit comprises a power receiving antenna and the power receiving circuit is configured to receive the electric power transmitted by the power supply antenna through the power receiving antenna;
   wherein the power supply circuit further comprises a power supply loop, the power receiving circuit further comprises a power receiving loop,
   the power supply loop, the power supply antenna, the power receiving antenna and the power receiving loop are disposed on a same printed circuit board, and
   the power supply loop and the power receiving loop are located on a same surface of the same printed circuit board;
   the power supply loop comprises a power supply resonance circuit and a high frequency resonance modulation circuit;
   the power receiving loop comprises a power receiving resonance circuit and an AC-DC converter;
   the power supply loop further comprises a power supply source, a gate driver, a control circuit, a crystal oscillator, and a power supply communication circuit; and
   the power receiving loop further comprises a DC/DC converter, a battery, a battery monitoring circuit, a regulator, and a power receiving communication circuit which is in communication with the power supply communication circuit.

2. The transformer according to claim 1, wherein the power supply antenna is separated from the power receiving antenna.

3. The transformer according to claim 1, wherein the power supply circuit comprises a power supply ground terminal, the power receiving circuit comprises a power receiving ground terminal, and the power supply ground terminal is electrically connected with the power receiving ground terminal.

4. The transformer according to claim 1, wherein the printed circuit board comprises a first side and a second side which are disposed opposite to each other, the power supply antenna is disposed on the first side of the printed circuit board, and the power receiving antenna is disposed on the second side of the printed circuit board.

5. The transformer according to claim 4, wherein the power supply antenna is disposed on a surface of the first side, and the power receiving antenna is disposed on a surface of the second side.

6. The transformer according to claim 5, wherein the power supply antenna and the power receiving antenna both are helical antennas.

7. The transformer according to claim 5, wherein the power supply antenna and the power receiving antenna both are cylindrical helical antennas.

8. The transformer according to claim 7, wherein the cylindrical helical power supply antenna and the cylindrical helical power receiving antenna are coaxially disposed.

9. The transformer according to claim 7, wherein an axis of the cylindrical helical power supply antenna and an axis of the cylindrical helical power receiving antenna both are perpendicular to the surface of the first side or the surface of the second side.

10. The transformer according to claim 1, wherein the transformer is a resonance wireless power supply transformer, and a working frequency of the transformer is from 10 kHz to 30 MHz.

11. A power supply board, comprising the transformer according to claim 1.

12. The transformer according to claim 1, wherein the transformer is a resonance wireless power supply transformer, and a working frequency of the transformer is from 10 kHz to 30 MHz.

* * * * *